United States Patent [19]

Tanagawa

[11] Patent Number: 5,052,002

[45] Date of Patent: * Sep. 24, 1991

[54] METHOD OF DETECTING AND INDICATING ERRORS IN A MEMORY DEVICE

[75] Inventor: Kouzi Tanagawa, Tokyo, Japan

[73] Assignee: Oki Electric Industry Co., Ltd., Tokyo, Japan

[ * ] Notice: The portion of the term of this patent subsequent to Oct. 30, 2007 has been disclaimed.

[21] Appl. No.: 569,601

[22] Filed: Aug. 20, 1990

Related U.S. Application Data

[62] Division of Ser. No. 245,296, Sep. 16, 1988, Pat. No. 4,967,415.

[30] Foreign Application Priority Data

Sep. 18, 1987 [JP] Japan ................... 62-232526

[51] Int. Cl.$^5$ ............................. G06F 11/10
[52] U.S. Cl. ...................... 371/51.1; 371/6; 371/21.4
[58] Field of Search ............. 371/21.1, 21.4, 6, 51.1; 365/201

[56] References Cited

U.S. PATENT DOCUMENTS

| | | | |
|---|---|---|---|
| 4,218,764 | 8/1980 | Furuta et al. | 365/222 |
| 4,266,283 | 5/1981 | Perlegos et al. | 365/104 |
| 4,375,099 | 2/1983 | Waters et al. | 371/6 |
| 4,393,475 | 7/1983 | Kitagawa et al. | 365/201 |
| 4,456,992 | 6/1984 | Schaub | 371/6 |
| 4,587,653 | 5/1986 | Hogge, Jr. | 371/6 |
| 4,689,772 | 8/1987 | Jordy et al. | 365/201 |
| 4,779,272 | 10/1988 | Kohda et al. | 371/21.4 |
| 4,841,232 | 6/1989 | Graham et al. | 371/6 |
| 4,903,265 | 2/1990 | Shannon et al. | 371/21.4 |
| 4,967,415 | 10/1990 | Tanagawa | 371/21.4 |

OTHER PUBLICATIONS

IBM Technical Disclosure Bulletin, vol. 26, No. 2, Jul. 1983, pp. 745-748, R. J. Defilippi, "Differential Memory Output Validity Detector".
IEEE Transactions on Reliablity, vol. R36, No. 2, Jun. 1987, pp. 222-223, T. Haifley, "Endurance of EEPROMs with On-Chip Error Correction".

Primary Examiner—Charles E. Atkinson
Attorney, Agent, or Firm—Wenderoth, Lind & Ponack

[57] ABSTRACT

An EEPROM system with an error detecting function includes: a memory cell matrix composed of a plurality of MOS memory cells and a plurality of bit lines connected separately to the plurality of MOS memory cells; and a plurality of intermediate state detecting circuits connected separately to the plurality of bit lines for detecting an intermediate state other than writing and erasing states of the MOS memory cells, and for outputting an error bit indicating signal, the intermediate state being a threshold voltage between a threshold voltage of a storage MOS memory cell in a writing state included in each of the MOS memory cells and a threshold voltage of the storage MOS memory cell in an erasing state.

15 Claims, 6 Drawing Sheets (a)

| OPERATION MODE | VOLTAGE AT EACH PORTION | | | |
|---|---|---|---|---|
| | BIT LINE | WORD LINE | SENSE LINE | GROUND LINE |
| IN READING | 2 v | 5 v | 2 v | 0 v |
| IN ERASING | 0 v | 20 v | 20 v | 0 v |
| IN WRITING | 20 v | 20 v | 0 v | FLOATING |

(b)

METHOD OF DETECTING AND INDICATING ERRORS IN A MEMORY DEVICE

This application is a divisional of allowed application Ser. No. 07/245,296, filed Sept. 16, 1988, now U.S. Pat. No. 4,967,415, issued Oct. 30, 1990.

BACKGROUND OF THE INVENTION

1. Field of the Invention:

The present invention relates to a non-volatile semiconductor programmable ROM with a bit error detector included therein.

2. Description of the Prior Art:

An EEPROM is a non-volatile memory capable of electrical erasing and writing of information therein, and has found in recent years extensive application. For example, an IC card includes therein an EEPROM IC in the form of a chip for use in storage of important data (deposit information and health information, etc.) by a user. The EEPROM is therefore required for a function of detecting any bit error involved in data in order to correctly store such information. To detect any bit error caused in the EEPROM, it, is well known to add a parity bit to bits constituting a word. For example, Nikkei Electronics (Sept. 26, 1983) describes a principle for detection and correction of bit errors in "A high speed 1M bit mask ROM including therein an ECC circuit for improvement of the yield". A means to detect an error in data and to indicate its position is described below with reference to the Nikkei Electronics article.

FIG. 2 is a prior art EEPROM system having an error detecting circuit which includes memory cells each storing 1 word—that is—4 bits of data. The EEPROM system comprises data memory cells 10 for storing data D0 to D3 a data read circuit 30 for reading the data D0 to D3 stored in the data memory cells 10, bit lines 11 respectively connecting the data memory cells 10 to parts of the read circuits 30, logical output lines 12 respectively connected to the read circuits 30 for outputting the data read by the read circuits 30, parity memory cells 20 for storing parity bits, parity bit lines 21 connected between the parity memory cells 20 and the remaining parts of the read circuits 30, a bit error detecting circuit 2 composed of exclusive OR gates EOR1 to EOR3 each connected to the read circuits 30 via the logical output lines 12, and a position indicating circuit 1 composed of AND gates AND1 to AND4 connected to the exclusive OR gates EOR1 to EOR3 via logical output lines 22 for outputting error bit-indicating outputs e0 to e3, the AND gates AND1 to AND4 including therein parity data Po to P2. The EEPROM system is adapted to provide the three parity memory cells 20 correspondingly to the four memory cells 10 for each word, and further provide the parity memory cells 20 which respectively store pieces of parity information that respectively form even parities between the bit lines 21 and lines perpendicular thereto (word lines in general). Here, for example, the parity bit Po has an even parity relationship with the data D0, D2, and D3, the parity bit P1 also has an even parity relationship with the data D2, D1, and D3, and the parity bit P2 further also has an even parity relationship with the data D0, D1, and D2. The bit error detecting circuit 2, i.e., the exclusive OR gates EOR1 to EOR3 respectively output a logical "0" signal when the even parity condition holds, and otherwise output a logical "1" signal. For example, the exclusive OR gate EOR2 has the input bit lines D0, D1, and D3. Assumed here that D0="0", D1="0", D2="1", D3="0", P0="1", P1="0", and P2="1", the EOR2 outputs a "0", satisfying the even parity condition. This assures no error. Provided now the data D1 is assumed to have an error bit "1" at a bit position where it should have a bit "0" originally, the EOR2 outputs a "1" as a result of its logic and the EOR3 also outputs a "1", causing the AND2 in the error position indicating circuit 1 to output a "1". This shows that the data D1 has a bit error therein. The prior art EEPROM system with the error detecting circuit shown in FIG. 2 required three parity bits when the number of data bits constituting 1 word was equal to four, as described above.

On such a principle, (N+1) parity memory cells is generally needed for $2^N$ memory cells which constitute 1 word, to detect bit errors and to indicate bits in error. Additionally, the use of the even parity made it impossible to detect even bit errors. In other words, it was impossible to detect completely a plurality of errors involved in 1 word. From these reasons described above, the prior art EEPROM system with an error detecting circuit needed, upon fabrication thereof in a 1 word—8 bit construction, a 4 bit memory cell for each word, resulting in the total number of bits required to be increased by about 1.5 times in comparison to systems not including an error detecting circuit. The prior art EEPROM systems thus suffered from a problem in that the chip area was increased because of unsatisfactory chip efficiency to cause an increase in the cost of the device. It further suffered from another problem in that there was an incomplete error detection for a plurality of bits.

SUMMARY OF THE INVENTION

In view of the drawbacks of the prior arts, it is an object of the present invention to provide an EEPROM system with an error detecting function capable of detection of any bit error and of indication of a position thereof in the data without the use of many parity memory cells each having insufficient chip efficiency.

Another object of the present invention is to provide an EEPROM system provided with an error detecting function capable of error correction for odd bits by additionally providing an 1 bit parity memory cell for each word.

Still another object of the present invention is to provide an EEPROM system provided with an error detecting function capable of detection of any memory cell which has the possibility of inadvantageously becoming deteriorated in the near future.

An object of the present invention is to provide a method of detecting and indicating errors in a memory device comprising: a plurality of word lines; a plurality of sense lines; a plurality MOS memory cells connected separately to said word lines and said sense lines; a plurality of bit lines connected separately to said MOS memory cells and a plurality of read circuits connected separately to said plurality of bit lines for reading and outputting data stored in said MOS memory cells; said method comprising the steps of:

measuring the potential at each of said bit lines so as to detect an intermediate state of any of said MOS memory cells other than writing and erasing states of MOS said memory cells, said intermediate state corresponding to an error;

outputting an error bit indicating signal upon detecting an intermediate state of one of said MOS memory cells.

In the above-noted method, the intermediate state may be defined to be a threshold voltage between a threshold voltage of each of said MOS memory cells in a writing state and a threshold voltage of each of said MOS memory cells in an erasing state.

Another object of the present invention is to provide a method of detecting and indicating errors in a memory device comprising: a plurality of word lines; a plurality of sense lines; a plurality of MOS memory cells connected to said plurality of word lines and to said plurality of sense lines each of selecting one of said word lines and for storing data inputted therein though a selected one of said word lines; a parity check MOS memory cell for adding a 1 parity bit to the associated data; a plurality of bit lines connected separately to said MOS memory cells and to said parity check MOS memory cell and a plurality of reads circuits separately connected to said bit lines for reading and outputting said data storage and said MOS memory cells; said method comprising the steps of:

measuring the potential at each of said bit lines so as to detect an intermediate state of any of said MOS memory cells other than write and erase states of said MOS memory cells, said intermediate state corresponding to an error and being a threshold voltage between a threshold voltage of said MOS memory cells in a writing state and a threshold voltage of said MOS memory cells in an erasing state;

outputting an error bit indicating signal upon detecting an intermediate state of any of said MOS memory cells;

measuring the potential at a point of said parity check MOS memory cell so as to detect said intermediate state other than the writing and erasing states of said parity check MOS memory cell;

outputting a parity check error bit indicating signal upon detecting an intermediate state of said parity check MOS memory cell.

Still another object of the present invention is to provide a method of detecting and indicating errors in a memory device comprising a memory cell group including a plurality of memory cells, said memory cells each storing data therein, and having an output node and causing an electrical potential to be produced at said output node thereof according to the data stored therein and a plurality of discriminating circuits each receiving an electrical potential from an output node of a corresponding memory cell and said memory group, for a respectively discriminating between first and second logic levels of data stored in said memory cells with respect to a first threshold potential, said discriminating circuits respectively generating discriminations signals each indicating one of said first and second logic levels;

said method comprising the steps of:

separately measuring electrical potentials form output nodes of each memory cell in a memory cell group for detecting an error when the electrical potential is between said second and third threshold potentials, said second threshold potential being above said first threshold potential and said third potential being below said first threshold potential;

generating an error detection signal when the measured electrical potential of an output node is between said second and third threshold potentials.

In the above-noted method, when data in each of said memory cells of said memory cell group is selectively erased and written at respective erasing and writing voltages, said second potential is defined to be between said first threshold potential and a maximum electrical potential generated by said memory cell after data stored therein has been erased and wherein said third threshold potential is defined to be between said first threshold potential and a minimum electrical potential generated by said memory cell after data stored therein has been written.

Furthermore, in the above-noted method, if the memory device further includes a parity memory cell, associated with said cell group, for storing parity data therein, and having an output node and causing an electrical potential to be produced at said output node thereof according to the parity data stored therein, said method further includes the steps of measuring the electrical potential from said output node of said parity memory cell for discriminating between first and second logic levels of said parity data with respect to said first threshold potential and for generating a discrimination signal in response to detecting that the electrical potential is between said first and second logic levels of said parity data.

The above-noted method may further comprising the steps of detecting that an erroneous discrimination signal exists in said discrimination signals and for generating an indication signal indicating that an erroneous discrimination signal exists and for generating an opposite signal opposed to a logic level indicated by a received discrimination signal from a corresponding discrimination circuit upon a detection signal being received from a corresponding detection circuit, whereby the erroneous discrimination signal is corrected.

The above-noted method may also further comprising the steps of measuring the electrical potential of said output node of said parity memory cell for detecting that said electrical potential is between said second and third threshold potentials and for generating a detection signal upon detecting that said electrical potential is between said second and third threshold potentials.

The above-noted method may further include the steps of detecting that an erroneous discrimination signal exists in said discrimination signals and for generating an indication signal indicating that an erroneous discrimination signal exists and for generating an opposite signal opposed to one of said first and second logic levels indicated by said discrimination signal upon said detection signal indicating that said electrical potential of said output node and said parity memory cell is between said second and third threshold potentials, whereby the erroneous discrimination signal is corrected.

Another object of the present invention is to provide a method of detecting and indicating errors in a memory device comprising a memory cell for storing data therein, said memory cell having an output node and causing an electrical potential to be produced at said output node thereof according to data stored therein and a discriminating circuit for receiving said electrical potential from said output node of said memory cell and for discriminating between first and second logic levels of data stored in said memory cell with respect to a first threshold potential, said discriminating circuit generating a discrimination signal indicating one of said first and second logic levels;

said method comprising the steps of measuring the electrical potential from an output node of said memory cell for detecting an error when the electrical potential is between said second and third threshold potentials, said second threshold potential being above said first threshold potential and said third threshold potential being below said first threshold potential;

generating an error detection signal when the measured electrical potential of the output node is between said second and third threshold potentials.

In the above-noted method, when data in said memory cell is selectively erased and written at respective erasing and writing voltages, said second potential as defined to be between said first threshold potential and a maximum electrical potential generated by said memory cell after data stored therein has been erased and wherein said third threshold potential as defined to be between said first threshold potential and a minimum electrical potential generated by said memory cell after data stored therein has been written.

In the above-noted method, if the memory device further includes a parity memory cell, associated with said cell group, for storing parity data therein, and having an output node and causing an electrical potential to be produced at said output node thereof according to the parity data stored therein, said method further includes the step of measuring the electrical potential from said output node of said parity memory cell for discriminating between first and second logic levels of said parity data with respect to said first threshold potential and for generating a discrimination signal in response to detection that the electrical potential is between said first and second logic levels of said parity data.

The above-noted method may further comprising the steps of detecting that an erroneous discrimination signal exists in said discrimination signals and for generating an indication signal indicating than an erroneous discrimination signal exits and for generating an opposite signal opposed to a logic level indicated by a received discrimination signal from corresponding discrimination circuit upon a detection signal being received from a corresponding detection circuit, whereby the erroneous discrimination signal is corrected.

The above-noted method may also further comprising the steps of measuring the electrical potential of said output node of said parity memory cell for detecting that said electrical potential is between said second and third threshold potentials and for generating a detection signal upon detecting that said electrical potential is between said second and third threshold potentials.

The above-noted method may still further including the steps of detecting that an erroneous discrimination signal exits in said discrimination signals and for generating an indication signal indicating than an erroneous discrimination signal exits and for generating an opposite signal opposed to one of said first and second logic levels indicated by said discrimination signal upon said detection signal indicating that said electrical potential of said output node and said parity memory cell is between said second and third threshed potentials, whereby the erroneous discrimination signal is corrected.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENT

In what follows, an embodiment of an EEPROM system provided with an error detecting function will be described with reference to the accompanying drawings.

First, the arrangement and operation of a memory cell constituting the EEPROM system will be described with reference to FIGS. 3(a), 3(b), 4, and 5.

Figure 4:
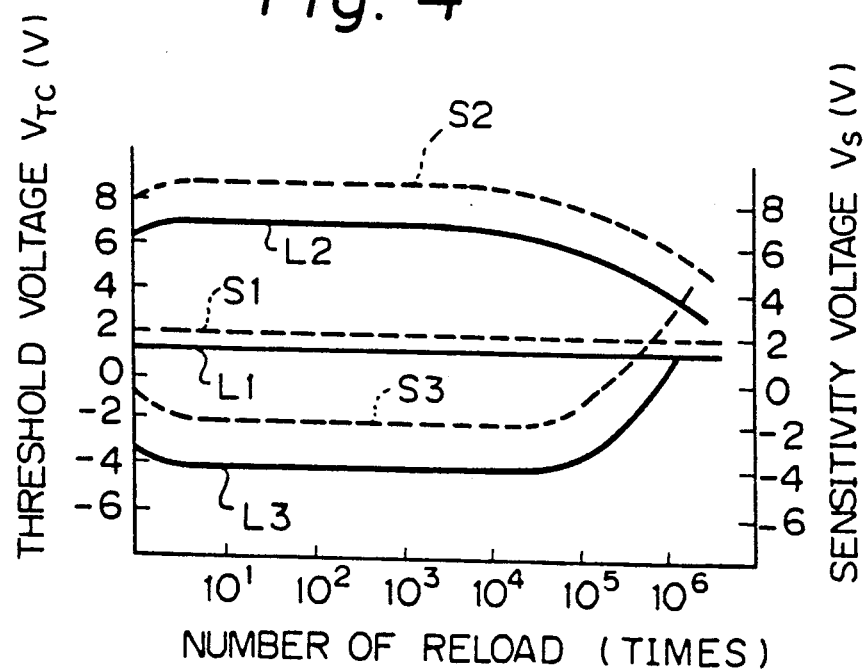
FIG. 4 is a view illustrating the characteristics of threshold voltage $V_{TC}$ and sensitivity voltage $V_s$ of a read circuit with respect to the number of reloads of information in the memory cell of FIG. 1.
Figure 2:
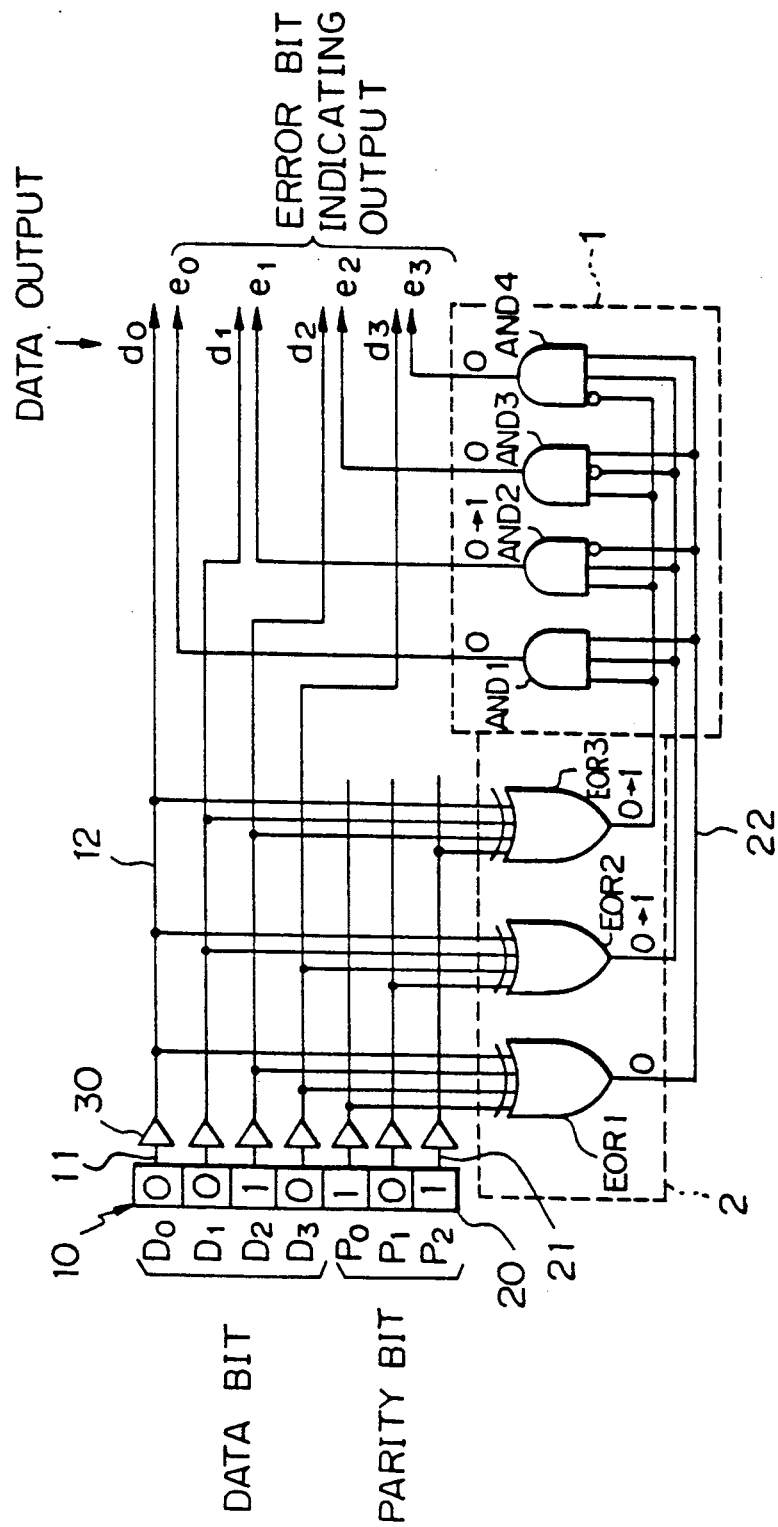
FIG. 2 is a circuit diagram illustrating a portion of a prior art EEPROM system provided with an error detecting function.
Figure 5:
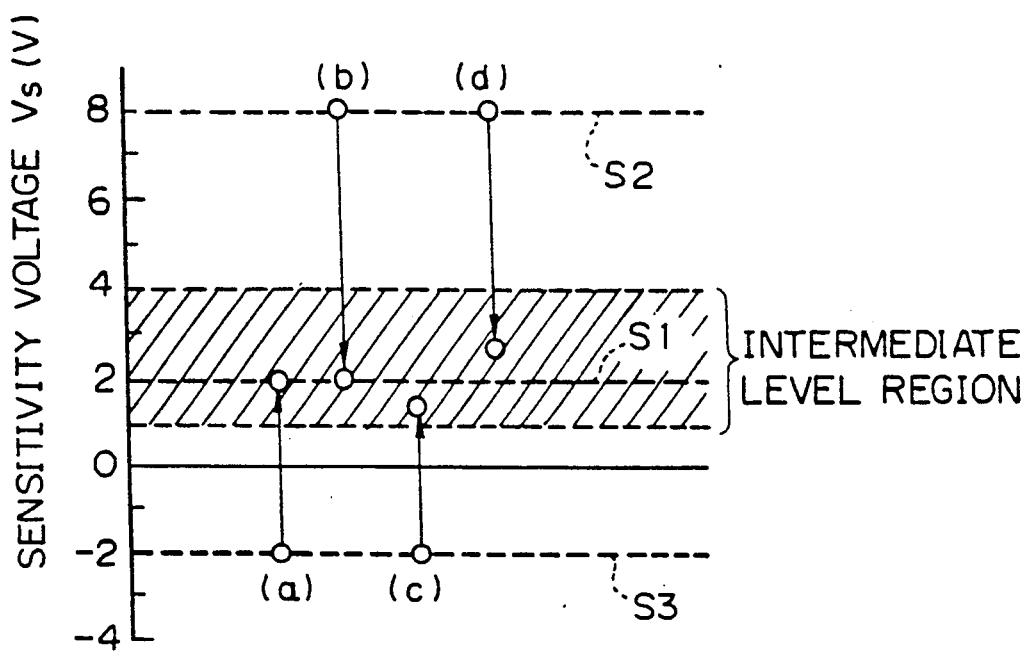
FIG. 5 is a view illustrating the change in the sensitivity voltage $V_s$ of the read circuit.

FIG. 3(a) is an equivalent circuit diagram of the memory cell for use in the EEPROM system, and FIG. 3(b) is a view illustrating the operating conditions of read, erase, and write of the memory cell; FIG. 4 is a view illustrating the characteristics of threshold voltage $V_{TC}$ of the memory cell and sensitivity voltage $V_s$ of a read circuit both with respect to the number of times of the writing of information into the memory cell, and FIG. 5 is a view illustrating a change in the sensitivity voltage $V_s$ of the read circuit.

The arrangement and operation of the memory cell is described for example in "16K bit EEPROM electrically erasable in a byte unit", Nikkei Electronics, No. June 23, 1980, pp 198 to 207.

Referring to FIG. 3(a), the memory cell includes a data selection MOS transistor Q1, and a storage memory MOS transistor Q2 of the type having a double-layered polysilicon gate, both transistors being connected in series and the latter transistor having a floating gate 17.

The data selection MOS transistor Q1 has a first electrode coupled to a bit line 14, a second electrode coupled to the memory MOS transistor Q2, and a gate electrode coupled to a lead line 15. The memory MOS transistor Q2 has a first electrode coupled to the second electrode of the data selection MOS transistor Q1, a gate electrode coupled to a sense (or program) line 16, the floating, gate electrode 17, and a second electrode coupled to a ground line 13.

The storage MOS transistor Q2 forms a thin oxide film (tunneling oxide film) between the first electrode (drain) thereof and the floating gate 17, through which electrons and holes are injected into the floating gate 17 for erase and write operations.

Referring further to FIG. 3(b), voltages at respective portions of the memory cell are assumed in a read operation, for example, to be as follows: 2V on the bit line 14, 5V on the word line 15, 2V on the sense line 16, and a ground potential on the ground line 13.

Here, accumulation of electrons on the floating gate 17 of the storage MOS transistor Q2 allows the threshold voltage $V_{TC}$ for the storage MOS transistor Q2 to be raised. For this, the storage MOS transistor Q2 is turned off when the threshold voltage $V_{TC}$ is above the potential of the sense line 16, while it is turned on when the $V_{TC}$ is below the same potential.

Referring to the same figure, the voltages at the respective portions of the memory cell are assumed in the erase operation, for example, to be as follows: 0V on the bit line 14, a high voltage (e.g. 20V) on the word line 15, 20V on the sense line 16, and 0V on the ground line 13. The floating gate 17 of the storage MOS transistor Q2 is thereby injected with electrons through the tunneling effect because of a sufficiently high voltage being induced between the floating gate 17 and the first gate. This causes the threshold voltage $V_{TC}$ of the storage MOS transistor Q2 to be raised.

Furthermore, referring to the same figure, the voltages at the respective portions of the memory cell are assumed in the write operation, for example, to be as follows: 20V on the bit line 14, 20V on the word line 15, 0V on the sense line 16, with the ground line kept at the floating state. The floating gate 17 is thereby forced to release therefrom the electrons accumulated thereon to a substrate and is instead injected with holes from the substrate. This causes the threshold voltage $V_{TC}$ of the storage MOS transistor Q2 to be lowered.

Referring to FIG. 4, changes in the threshold voltage $V_{TC}$ of the memory cell and in the sensitivity voltage Vs of a read circuit with respect to the number of times of a reloading operation for the memory cell will be described. In this situation, the conditions of the voltage applied to the memory cell and the write time into the memory cell are kept unchanged. In the figures, a line L1 shows the threshold voltage $V_{TV}$ (e.g., 1V) of the memory cell where no charge is accumulated on the floating gate 17 (neutral), with a line L2 showing the threshold voltage $V_{TC}$ after the erase operation and a line L3 showing the same voltage after the write operation. As illustrated in the figure, repeated reload operations produce trapping levels for electrons and holes in the tunneling oxide film, which causes deterioration of the characteristics of the memory cell such as a reduction of the threshold voltage thereof, reduction of an interval to hold information therein, and lowering of the dielectric voltage of the gate insulating films involved, etc. Reload times of $10^3$ cause no change in the threshold voltage $V_{TC}$, but those of $10^4$ permit $V_{TC}$ to start to be reduced.

In the memory cell having the characteristics shown by the lines L2, and L3 of FIG. 4, the application of 2V to the sense line 16 upon the read operation causes a current to flow through the memory cell from the bit line. A read circuit (sense amplifier) described later senses and amplifies the current. In general, a large current flowing through the memory cell (this occurs in a write state) is outputted as a logic "0", while a small current this occurs in an erase state) is outputted as a logic "1". The sensitivity current (corresponding to the sensitivity voltage Vs of the sense line 16) of the read circuit (sense amplifier) is typically set to be larger than that flowing when the threshold voltage $V_{TC}$ is applied to the gate of the storage MOS transistor Q2. As illustrated in FIG. 4, the sensitivity voltage Vs upon the threshold voltage $V_{TC}$ being 1V (refer to the line L1) is 2V, and hence, the application of a voltage 3V to the sense line 16 causes the sense amplifier (not shown) connected to the bit line 14 to invert its output logic. In the same fashion, with the threshold voltage $V_{TC}$ along the line L2, the sensitivity voltage Vs is about 8V, for example, (refer to a line S2), and with the $V_C$ along the line L3, the Vs is about $-2V$ for example, (refer to a line S3).

Here, a change in the threshold voltage $V_{TC}$ of the memory cell having such characteristics will be described, the change being produced owing to insufficient dielectric voltage of the oxide film and a leakage current through pin holes of the film.

As illustrated in FIG. 5, the sensitivity voltage Vs of the sense amplifier (not shown) is varied owing to the change in the threshold voltage of the MOS memory cell. In FIG. 5(a), when the memory cell in the write state is deteriorated to release completely charges accumulated thereon, the sensitivity voltage Vs is changed from $-2V$ (refer to the line S3) to 2V (refer to the line S1). Additionally, in FIG. 5(b) when the memory cell in the erase state releases completely changes accumulated thereon, the sensitivity voltage Vs is changed from 8V (refer to the line S2) to 2V (refer to the line S1). The principle of the present invention is to utilize a fact that when the memory cell in the write or erase state releases parity charges accumulated thereon, the sensitivity voltage Vs does not cross a potential of 2V for example, as shown in FIGS. 5(d) and (c).

An intermediate detecting circuit (bit error detecting circuit) according to the present invention is adapted to output an error signal the threshold voltage $V_{CT}$ (or the sensitivity voltage $V_S$) lies in the vicinity of the intermediate level (e.g., line $S_1$) upon the read operation of the storage MOS transistor.

Figure 1:
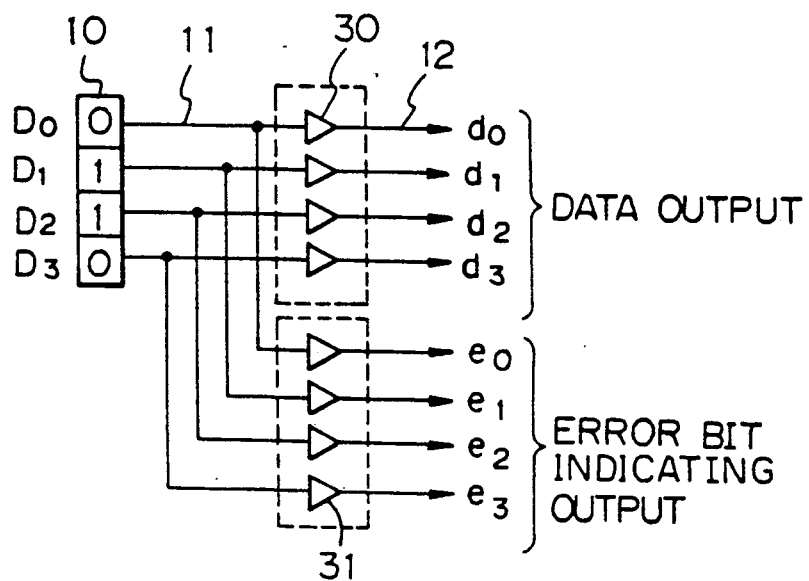
FIG. 1 is a circuit diagram illustrating a portion of an embodiment of an EEPROM system provided with an error detecting function according to the present invention.

In the following, the embodiment of the EEPROM system including such an intermediate state detecting circuit (bit error detecting circuit) will be described with reference to FIG. 1. FIG. 1 illustrates part of the EEPROM system.

Referring to FIG. 1, the EEPROM system includes a memory matrix 10 composed memory cells D0, D1, D2, and D3 for storing and outputting word information and of a plurality of bit lines 11, and a plurality of read circuits 30 connected to respective bit lines 11. The EEPROM. system further includes a plurality of the intermediate state detecting circuits 31 (bit error detecting circuits) connected to the respective bit lines 11 for outputting error bit indicating signals $e_0$, $e_1$, $e_2$, and $e_3$. Each of the memory cells D0, D1, D2, and D3 includes a selection MOS transistor Q1 and a storage MOS transistor Q2, as illustrated in FIG. 3(a) for example.

Figure 8:
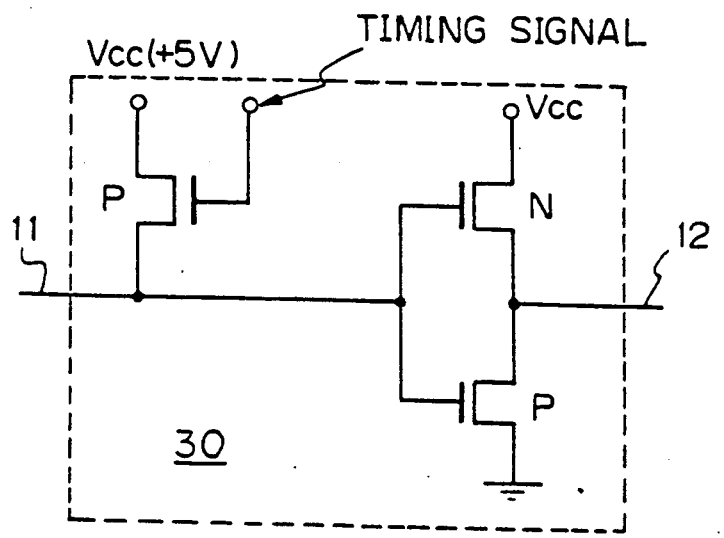
FIG. 8 is a circuit diagram illustrating a read circuit of FIG. 1.

The read circuit 30 includes a CMOS inverter and a PMOS transistor, as illustrated in FIG. 8.

The intermediate state detecting circuit 31 includes an NMOS transistor 43 composed of a gate electrode connected to one of the plurality of the bit lines 11, a first electrode, and a second electrode connected to a ground potential. The intermediate state detecting circuit 31 further includes a PMOS transistor 41 composed of a first electrode connected to a power supply $V_{cc}$, a second electrode, and a gate electrode, a resistor means 42 connected to the second electrode of the PMOS transistor 41 and the first electrode of the NMOS transistor 43; a MOS load means 40 connected between the power supply $V_{cc}$ and the gate electrodes of the PMOS transistor 41 and the NMOS transistor 43; and an AND gate 45 connected to, at one input thereof, the second electrode of the PMOS transistor 41 and connected, at the other input, to the first electrode of the NMOS transistor 43 via an inverter 44. The intermediate state detecting circuit 31 outputs a logic "0" when the memory cell is at the write and erase states (i.e., $S_2$ or $S_3$ in FIG. 4), while outputting a logic "1" when it is at the intermediate state (i.e., $S_1$, 1 to 4 V for example), as illustrated in FIG. 5. The NMOS transistor 43 inputs a signal from the bit line 11, and the AND gate 45 outputs an 1 bit error indicating signal corresponding to the associated bit line 11.

Figure 3:
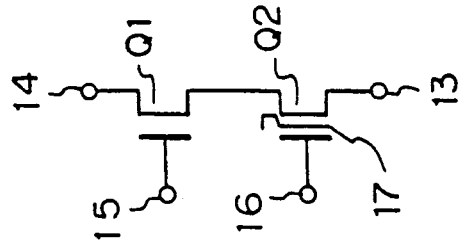
FIG. 3(a) is an equivalent circuit diagram of a memory cell for use in the EEPROM system of FIG. 1.
FIG. 3(b) is a view illustrating operating conditions of read, erase, and write for the EEPROM system of FIG. 1.

In succession, operation of the first embodiment will be described with reference to FIGS. 1, 3, and 6.

Referring to FIG. 1, the first embodiment of the EEPROM system with an error detecting function of the present invention is shown. In FIG. 1, the read circuit 30 is set, as the sensitivity voltage $V_s$, to the read potential $S_1$ (e.g., 2 V) where no charge is accumulated on the floating gate of the memory cell 10. The intermediate state detecting circuit 31 is set, as the threshold level, to the intermediate potential (e.g., 1 to 4 V). The intermediate state detecting circuit 31 thereby outputs a logic "1" when the bit lines 11 are at 1 to 4 volts, while outputting a logic "0" when they are above 4 V (erasing state) or below 1 V (writing state).

Figure 6:
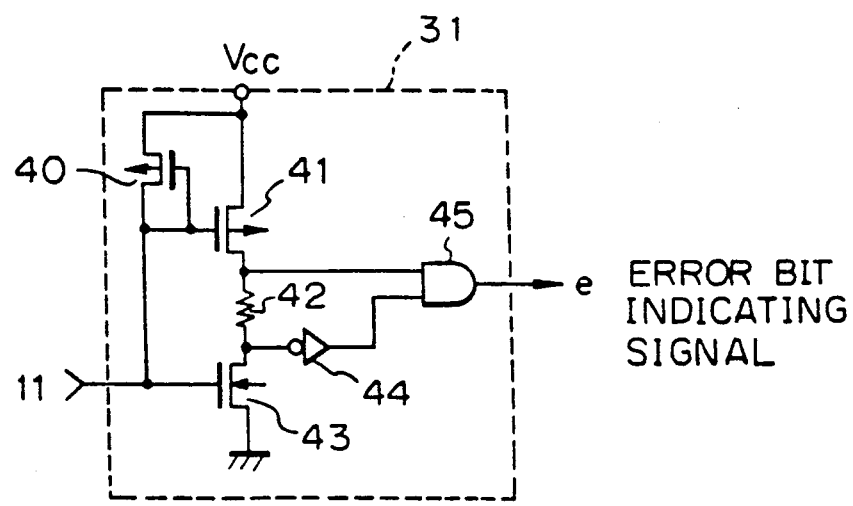
FIG. 6 is a circuit diagram of an intermediate state detecting circuit of FIG. 1.

Referring to FIG. 6, the intermediate state detecting circuit 31 is shown. As illustrated in the figure, the intermediate state detecting circuit 31 allows, when the bit line 11 is at 1 to 4 V, the AND gate 45 to output a logic "1" (error indicating signal) because the P and N transistors 41 and 43 are conductive. When the bit line 11 is less than 1 V or more than 4 V, the AND gate 45 outputs a logic "0".

Here, in the EEPROM system of FIG. 1, it is assumed that data "0110" is stored in the memory cells D0 to D3 in the memory cell matrix 10, and the memory cell is faulty so that the bit lines 11 upon read operation are at the intermediate potential (e.g., the state of FIG. 5(b)). In this situation, the read circuits 30 output 1 word data "0110" as output data $d_0$ to $d_3$, while the intermediate state detecting circuits 31 outputting data "0100" as bit error indicating output data, thus informing us of a fact that the bit of the memory cell $d_1$ will be deteriorated (i.e., changed to an error bit in future). This assures not only the indication of the bit error as described above, but also the utilization of the bit error indicating signal for correction of the error produced in the 1 word data (4 bits). Also, when the intermediate potential on the bit line 11 is less than the sensitivity voltage of the read circuit as shown in FIG. 5(c), a bit error indicating signal is outputted alike.

In the following, a second embodiment of the EEPROM system with an error detecting function of the present invention will be described with reference to FIG. 7.

Figure 7:
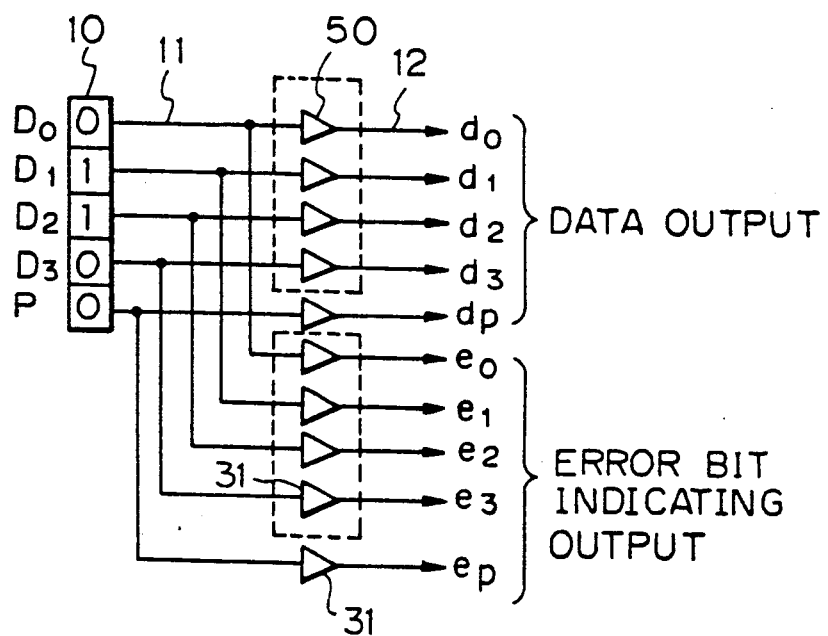
FIG. 7 is a circuit diagram illustrating a portion of a second embodiment of the EEPROM system provided with the error detecting function according to the present invention.

As illustrated in FIG. 7, the second embodiment includes, additionally to the first embodiment of FIG. 1, a parity memory cell provided in the memory cell matrix 10 for checking 1 bit parity, an additional read circuit 50 connected to the parity memory cell P, and an additional intermediate state detecting circuit 60 connected to the parity memory cell P.

Figure 9:
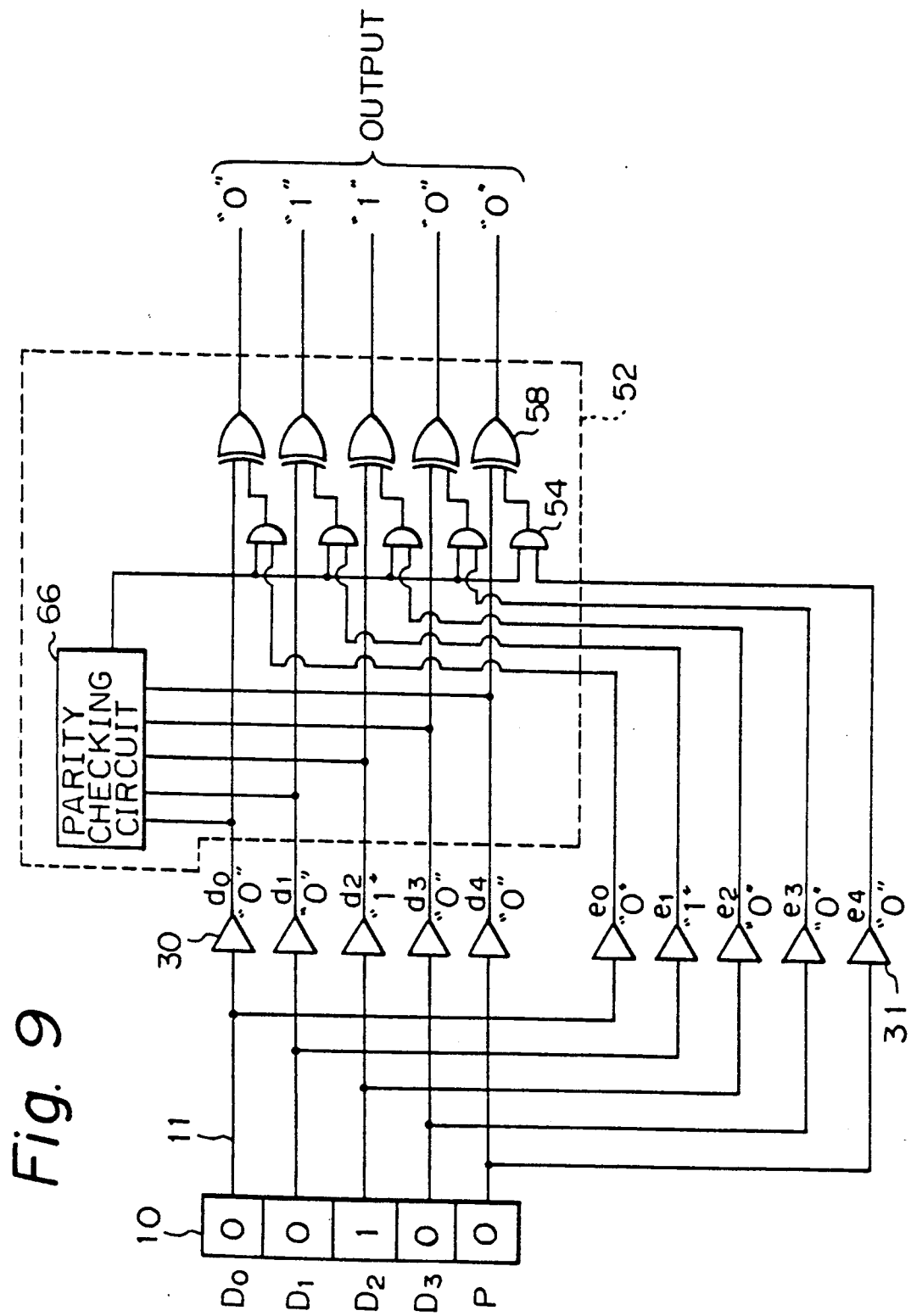
FIG. 9 is a circuit diagram illustrating an 1 bit correcting circuit.

With the arrangement described above, the bit signals $d_0$ to $d_p$ and the error bit indicating outputs $e_0$ to $e_3$ on logical output lines 12 corresponding to the respective memory cells are inputted together with a parity bit error indicating signal $e_p$ into a bit correcting circuit 52, for example, as illustrated in FIG. 9.

The bit correcting circuit 52 includes, for example, a parity checking circuit 66, a plurality of EOR gates 58, and a plurality of AND gates 54, for correcting any error bit.

The second embodiment of the EEPROM system of FIG. 7 also assures an error detecting and indicating signal when the threshold voltage of a fault memory cell is equal to the sensitivity voltage of the read circuit, and the threshold voltage of the memory cell is changed from a high potential to a predetermined intermediate level or less or from a low potential to the intermediate level or more. For example, when the memory cell D1 becomes an error state with its threshold value becoming the intermediate level (equal to or less than the sense level of the read circuit as shown in FIG. 5(d) for example), the read circuits $d_0$ to $d_4$ output read data "00100" including a parity bit. The parity check circuit 60, since the parity bit output is "0", effects the parity check and outputs a logic "1" if there are an odd number of "1s", informing us of a fact that a bit of the read data involves an error. The position of the error bit can be identified because of the error bit indicating output is "01000" and hence the memory cell D1 output is erroneous. Thereupon, the bit correcting circuit 60 inverts the output from the read circuit $d_1$ and outputs "01100" as a correct word.

Thereupon, correct data of the parity check may be set in a register (not shown) for use as corrected data. Thereupon, the addition of an 1 parity bit to the data enables, differing from the prior art, an error of the memory cell at the states of FIG. 5(a) and (b) to be detected irrespective of the number of bits constituting 1 word. The parity bit error signal $e_p$ shown in FIG. 7 is employed as a control signal for the bit correcting circuit.

According to the present invention, as described above, bit line potentials are detected upon reading the EEPROM system, and an error signal is outputted provided those potentials are at the intermediate state. This requires less parity bits for detection and correction of any error, differing from the prior art where many parity bits should be added. That is, the first embodiment of FIG. 1 requires no parity bit for correction of data, together with error detection for a plurality of bits. Additionally, the second embodiment of FIG. 7 can effect error correction using 1 bit parity for 1 word also from a state where charges are completely released. This sharplay reduces a chip area of an EEPROM provided with an error detecting function, the reduction amounting to 33% compared with a typical prior art system.

Although certain preferred embodiments have been shown and described, it should be understood that many changes an modifications may be made therein without departing from the scope of the appended claims.

What is claimed is:

1. A method of detecting and indicating errors in a memory device comprising: a plurality of word lines; a plurality of sense lines; a plurality of MOS memory cells connected separately to said word lines and said sense lines; a plurality of bit lines connected separately to said MOS memory cells and a plurality of read circuits connected separately to said plurality of bit lines for reading and outputting data stored in said MOS memory cells; said method comprising the steps of:

measuring the potential at each of said bit lines so as to detect an intermediate state of any of said MOS memory cells other than writing and erasing states of MOS said memory cells, said intermediate state corresponding to an error;

outputting an error bit indicating signal upon detecting an intermediate state of one of said MOS memory cells.

2. A method as recited in claim 1, wherein said intermediate state may be defined to be a threshold voltage between a threshold voltage of each of said MOS memory cells in a writing state and a threshold voltage of each of said MOS memory cells in an erasing state.

3. A method of detecting and indicating errors in a memory device comprising: a plurality of word lines; a plurality of sense lines; a plurality of MOS memory cells connected to said plurality of word lines and to said plurality of sense lines each of selecting one of said word liens and for storing data inputted therein through a selected one of said word lines; a parity check MOS memory cell for adding a 1 parity bit to the associated data; a plurality of bit lines connected separately to said MOS memory cells and to said parity check MOS memory cell and a plurality of reads circuits separately connected to said bit lines for reading and outputting said data storage and said MOS memory cells; said method comprising the steps of:

measuring the potential at each of said bit lines so as to detect an intermediate state of any of said MOS memory cells other than write and erase states of said MOS memory cells, said intermediate state corresponding to an error and being a threshold voltage between a threshold voltage of said MOS memory cells in a writing state and a threshold voltage of said MOS memory cells in an erasing state;

outputting an error bit indicating signal upon detecting an intermediate state of one of said MOS memory cells;

measuring the potential at a point of said parity check MOS memory cell so as to detect said intermediate state other than the writing and erasing states of said parity check MOS memory cell;

outputting a parity check error bit indicating signal upon detecting an intermediate state of said parity check MOS memory cell.

4. A method of detecting and indicating errors in a memory device comprising a memory cell group including a plurality of memory cells, said memory cells each storing data therein, and having an output node and causing an electrical potential to be produced at said output node thereof according to the data stored therein and a plurality of discriminating circuits each receiving an electrical potential from an output node of a corresponding memory cell and said memory group, for a respectively discriminating between first and second logic levels of data stored in said memory cells with respect to a first threshold potential, said discriminating circuits respectively generating discriminations signals each indicating one of said first and second logic levels; said method comprising the steps of:

separately measuring electrical potentials from output nodes of each memory cell in a memory cell group for detecting an error when the electrical potential is between said second and third threshold potentials, said second threshold potential being above said first threshold potential and said third potential being-below said first threshold potential;

generating an error detection signal when the measured electrical potential of an output node is between said second and third threshold potentials.

5. A method as recited in claim 4, wherein when data in each of said memory cells of said memory cell group is selectively erased and written at respective erasing and writing voltages, said second potential is defined to be between said first threshold potential and a maximum electrical potential generated by said memory cell after data stored therein has been erased and wherein said third threshold potential is defined to be between said first threshold potential and a minimum electrical potential generated by said memory cell after data stored therein has been written.

6. A method as recited in claim 4, wherein if the memory device further includes a parity memory cell, associated with said cell group, for storing parity data therein, and having an output node and causing an electrical potential to be produced at said output node thereof according to the parity data stored therein, said method further includes the steps of measuring the electrical potential from said output node of said parity memory cell for discriminating between first and second logic levels of said parity data with respect to said first threshold potential and for generating a discrimination signal in response to detecting that the electrical potential is between said first and second logic levels of said parity data.

7. A method as recited in claim 6, further comprising the steps of detecting that an erroneous discrimination signal exists in said discrimination signals and for generating an indication signal indicating that an erroneous discrimination signal exists and for generating an opposite signal opposed to a logic level indicated by a received discrimination signal from a corresponding discrimination circuit upon a detection signal being received from a corresponding detection circuit, whereby the erroneous discrimination signal is corrected.

8. A method as recited in claim 6, further comprising the steps of measuring the electrical potential of said output node of said parity memory cell for detecting that said electrical potential is between said second and third threshold potentials and for generating a detection signal upon detecting that said electrical potential is between said second and third threshold potentials.

9. A method as recited in claim 8, further including the steps of detecting that an erroneous discrimination signal exits in said discrimination signals and for generating an indication signal indicating that an erroneous discrimination signal exists and for generating an opposite signal opposed to one of said first and second logic levels indicated by said discrimination signal upon said detection signal indicating that said electrical potential of said output node and said parity memory cell is between said second and third threshold potentials, whereby the erroneous discrimination signal is corrected.

10. A method of detecting and indicating errors in a memory device comprising a memory cell for storing data therein, said memory cell having an output node and causing an electrical potential to be produced at said output node thereof according to data stored therein and a discriminating circuit for receiving said electrical potential from said output node of said memory cell and for discriminating between first and second logic levels of data stored in said memory cell with respect to a first threshold potential, said discriminating circuit generating a discrimination signal indicating one of said first and second logic levels;

said method comprising the steps of measuring the electrical potential from an output node of said memory cell for detecting an error when the electrical potential is between said second and third threshold potentials, said second threshold potential being above said first threshold potential and said third threshold potential being below said first threshold potential;

generating an error detection signal when the measured electrical potential of the output node is between said second and third threshold potentials.

11. A method as recited in claim 10, wherein when data in said memory cell is selectively erased and written at respective erasing and writing voltages, said second potential as defined to be between said first threshold potential and a maximum electrical potential generated by said memory cell after data stored therein has been erased and wherein said third threshold potential as defined to be between said first threshold potential and a minimum electrical potential generated by said memory cell after data stored therein has been written.

12. A method as recited in claim 10, wherein if the memory device further includes a parity memory cell, associated with said cell group, for storing parity data therein, and having an output node and causing an electrical potential to be produced at said output node thereof according to the parity data stored therein, said method further includes the steps of measuring the electrical potential from said output node of said parity memory cell for discriminating between first and second logic levels of said parity data with respect to said first threshold potential and for generating a discrimination signal in response to detecting that the electrical potential is between said first and second logic levels of said parity data.

13. A method as recited in claim 12, further comprising the steps of detecting that an erroneous discrimination signal exists in said discrimination signals and for generating an indication signal indicating that an erroneous discrimination signal exists and for generating an opposite signal opposed to a logic level indicated by a received discrimination signal from corresponding discrimination circuit upon a detection signal being received from a corresponding detection circuit, whereby the erroneous discrimination signal is corrected.

14. A method as recited in claim 12, further comprising the steps of measuring the electrical potential of said output node of said parity memory cell for detecting that said electrical potential is between said second and third threshold potentials and for generating a detection signal upon detecting that said electrical potential is between said second and third threshold potentials.

15. A method as recited in claim 14, further including the steps of detecting that an erroneous discrimination signal exits in said discrimination signals and for generating an indication signal indicating that an erroneous discrimination signal exists and for generating an opposite signal opposed to one of said first and second logic levels indicated by said discrimination signal upon said detection signal indicating that said electrical potential of said output node and said parity memory cell is between said second and third threshold potentials, whereby the erroneous discrimination signal is corrected.

* * * * *